United States Patent
Lackner et al.

(10) Patent No.: US 8,822,310 B2
(45) Date of Patent: Sep. 2, 2014

(54) METHOD, APPARATUS FOR HOLDING AND TREATMENT OF A SUBSTRATE

(71) Applicant: Infineon Technologies AG, Neubiberg (DE)

(72) Inventors: Gerald Lackner, Arnoldstein (AT); Christian Maier, Villach (AT); Francisco Javier Santos Rodriguez, Villach (AT)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 13/774,827

(22) Filed: Feb. 22, 2013

(65) Prior Publication Data

US 2013/0164939 A1  Jun. 27, 2013

Related U.S. Application Data

(62) Division of application No. 11/851,976, filed on Sep. 7, 2007.

(30) Foreign Application Priority Data

Sep. 7, 2006  (DE) .......................... 10 2006 042 026

(51) Int. Cl.
  H01L 21/46  (2006.01)
(52) U.S. Cl.
  USPC .......................... 438/464; 438/457; 438/458
(58) Field of Classification Search
  USPC .................. 438/455, 457, 458, 459, 460, 464
  See application file for complete search history.

(56) References Cited

U.S. PATENT DOCUMENTS

| | | |
|---|---|---|
| 227,252 A | 5/1880 | Hodges |
| 4,906,011 A | 3/1990 | Hiyamizu et al. |
| 5,961,375 A | 10/1999 | Nagahara et al. |
| 6,184,972 B1 | 2/2001 | Mizutani |
| 6,628,503 B2 | 9/2003 | Sogard |
| 6,644,641 B2 | 11/2003 | Phillips et al. |
| 6,706,618 B2 | 3/2004 | Takisawa et al. |
| 7,160,630 B2 | 1/2007 | Klos et al. |
| 2004/0258500 A1 | 12/2004 | Ireland et al. |
| 2005/0023647 A1 | 2/2005 | Nemoto et al. |
| 2005/0035514 A1 | 2/2005 | Hillman et al. |
| 2005/0219786 A1 | 10/2005 | Brown et al. |
| 2006/0038260 A1 | 2/2006 | Nemoto et al. |
| 2006/0040467 A1 | 2/2006 | Dolechek et al. |
| 2008/0064184 A1 | 3/2008 | Lackner et al. |
| 2009/0004824 A2 | 1/2009 | Lackner et al. |

OTHER PUBLICATIONS

"U.S. Appl. No. 11/851,976, Non Final Office Action mailed Feb. 28, 2013", 7 pgs.
"U.S. Appl. No. 11/851,976 Restriction Requirement mailed Jul. 15, 2010", 5 pgs.
"U.S. Appl. No. 11/851,976 , Response filed Feb. 1, 2013 to Final Office Action mailed Nov. 2, 2012", 9 pgs.

(Continued)

*Primary Examiner* — Kevin M Picardat
(74) *Attorney, Agent, or Firm* — Schwegman Lundberg & Woessner, P.A.

(57) ABSTRACT

Some embodiments discussed relates to an apparatus for holding a substrate, comprising a body with a surface for a semiconductor wafer to rest on, with the surface having a first surface area on which a first area of the semiconductor wafer can rest, and a second surface area on which a second area of the semiconductor wafer can rest, wherein the second surface area protrudes with respect to the first surface area.

19 Claims, 4 Drawing Sheets

(56) References Cited

OTHER PUBLICATIONS

"U.S. Appl. No. 11/851,976 , Response filed Jul. 11, 2011 to Final Office Action mailed May 10, 2011", 11 pgs.

"U.S. Appl. No. 11/851,976 Response filed Aug. 12, 2010 to Restriction Requirement mailed Jul. 15, 2010", 6 pgs.

"U.S. Appl. No. 11/851,976, Advisory Action mailed Jan. 18, 2013", 3 pgs.

"U.S. Appl. No. 11/851,976, Advisory Action mailed Aug. 1, 2011", 3 pgs.

"U.S. Appl. No. 11/851,976, Final Office Action mailed May 10, 2011", 8 pgs.

"U.S. Appl. No. 11/851,976, Final Office Action mailed Nov. 2, 2012", 6 pgs.

"U.S. Appl. No. 11/851,976, Non Final Office Action mailed May 17, 2012", 6 pgs.

"U.S. Appl. No. 11/851,976, Non-Final Office Action mailed Nov. 1, 2010", 10 pgs.

"U.S. Appl. No. 11/851,976, Response filed Jan. 31, 2011 to Non Final Office Action mailed Nov. 1, 2010", 10 pgs.

"U.S. Appl. No. 11/851,976, Response filed Jul. 6, 2012 to Non Final Office Action mailed May 17, 2012", 9 pgs.

"U.S. Appl. No. 11/851,976, Restriction Requirement mailed", 6 pgs.

"U.S. Appl. No. 11/851,976 , Response filed Jun. 27, 2013 to Non Final Office Action mailed Feb. 28, 2013", 8 pgs.

"U.S. Appl. No. 11/851,976, Final Office Action mailed Oct. 25, 2013", 6 pgs.

"U.S. Appl. No. 11/851,976, Notice of Allowance mailed Feb. 7, 2014", 5 pgs.

"U.S. Appl. No. 11/851,976, Response filed Dec. 26, 2013 to Final Office Action mailed Oct. 25, 2013", 8 pgs.

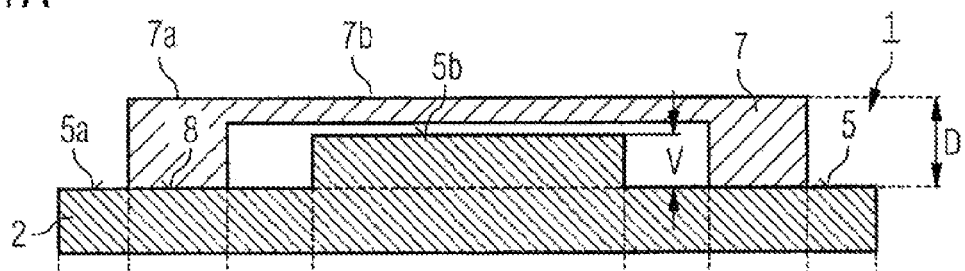
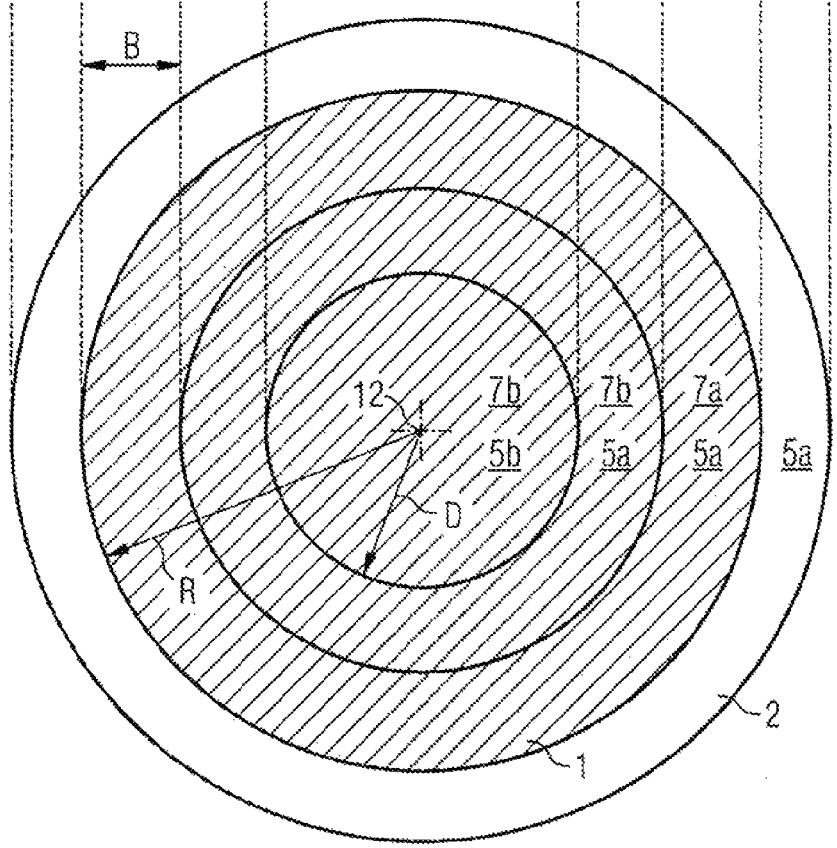

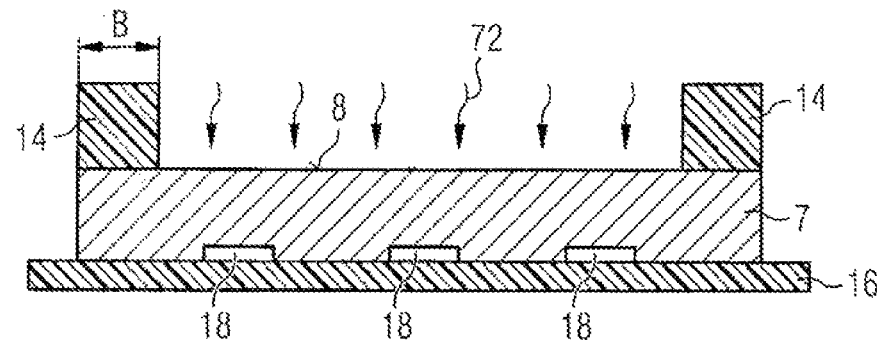
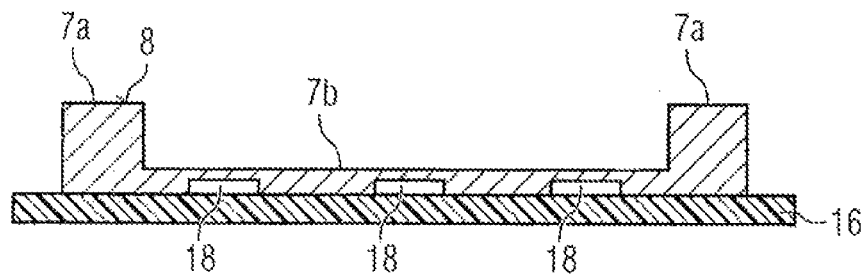
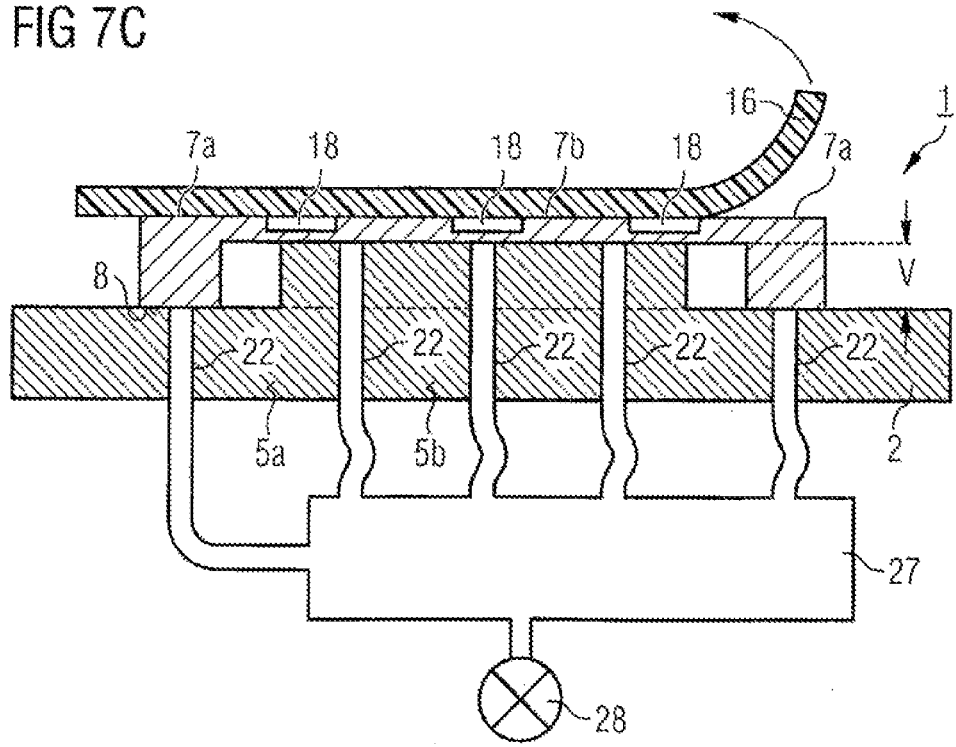

METHOD, APPARATUS FOR HOLDING AND TREATMENT OF A SUBSTRATE

RELATED APPLICATIONS

This patent application is a Division of U.S. application Ser. No. 11/851,976, filed Sep. 7, 2007, which claims the benefit of priority, under 35 U.S.C. Section 119, to German Patent Application Serial Number 10 2006 042 026.8, filed on Sep. 7, 2006, which applications are incorporated herein by reference in their entirety.

BACKGROUND

The present invention relates to an apparatus for holding a substrate, in particular a semiconductor substrate or wafer. The present invention furthermore relates to a method for treatment of a substrate.

Miniaturized components, for example integrated electrical circuits, are increasingly being produced on planar substrates. The prominent substrate type for components is semiconductor wafers which, during processing, are used not only as a mount but, owing to the capability to manipulate their conductance characteristics and the capability to structure them finely, are normally themselves part of the circuit. Hundreds of highly complex electronic circuit units can thus be produced on one semiconductor wafer.

In order to save space, to reduce costs and to improve the functionality of the components, very small structures are grown, applied to, etched or implanted in and on the semiconductor wafers. During this process, the structures must be tested repeatedly on the wafer and must be identified in order to verify the respective process step. Finally, the semiconductor wafers are normally sawed in order to obtain the individual circuit units (chips) from a semiconductor wafer.

In order to allow the structures to be produced, to be tested and to be sawed on a semiconductor wafer, the semiconductor wafers must be held in a well-defined position during the processing, must be supplied with well-defined electrical potentials, and/or must be subjected to well-defined environmental parameters, such as temperature or pressure. For this purpose, semiconductor wafers are normally placed on a semiconductor wafer holder (chuck). Owing to the high sensitivity of the semiconductor wafer surface to scratching, and the fragile nature of the brittle semiconductor material as the semiconductor wafer diameter increases, the semiconductor wafer holders must be designed such that the semiconductor wafer can be placed down, held and passed on again in a manner which protects it. The surface of the semiconductor wafer holders should also be such that scratching of the semiconductor wafers can be prevented.

BRIEF DESCRIPTION OF THE DRAWINGS

The invention will be explained in more detail in the following text, by way of example, by means of the following figures:

FIGS. 1a-1b show two mutually perpendicular sections through an apparatus for holding a substrate with a first surface area and a second surface area, in which a semiconductor wafer is placed on the apparatus, according some embodiments of the invention.

FIGS. 7a-7c show a method for treatment of a semiconductor wafer, according to some embodiments of the invention.

DETAILED DESCRIPTION

Figure 2:
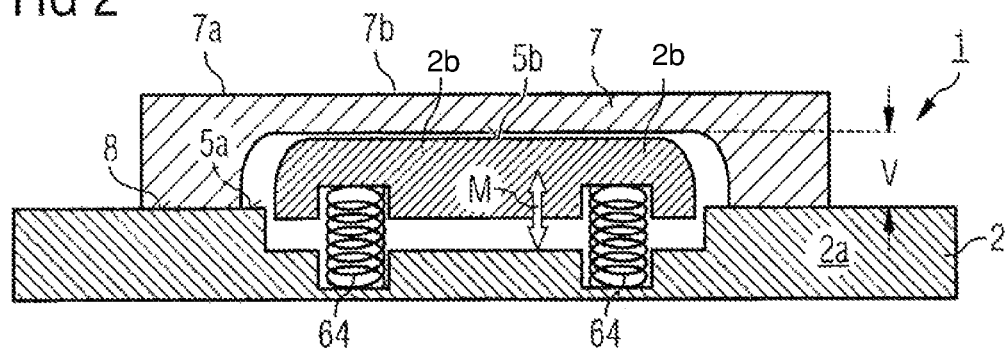
FIG. 2 shows an apparatus for holding a substrate as in FIG. 1a, in which the second surface area is arranged such that it can move with respect to the first surface area, according to some embodiments of the invention.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments. In this document, the terms "a" or "an" are used, as is common in patent documents, to include one or more than one. In this document, the term "or" is used to refer to nonexclusive or, such that "A or B" includes "A but not B," "B but not A," and "A and B," unless otherwise indicated.

In the following description, the terms "wafer" and "substrate" may be used interchangeably to refer generally to any structure on which integrated circuits are formed and also to such structured during various stages of integrated circuit fabrication. The term "substrate" is understood to include a semiconductor wafer. The term "substrate" is also used to refer to semiconductor structures during processing and may include other layers that have been fabricated thereupon. Both "wafer" and "substrate" include doped and undoped semiconductors, epitaxial semiconductor layers supported by a base semiconductor or insulator, as well as other semiconductor structures well known to one skilled in the art.

The expression an apparatus for holding a substrate, referred to in the following text as a substrate holder, can be understood as meaning holding structures or table apparatuses which can hold a substrate. If the substrate is a semiconductor wafer, then the substrate holder is, for example, a semiconductor wafer holder or a "chuck". The substrate holder comprises a body on which the semiconductor wafer can be placed, so that the semiconductor wafer is held by gravitation. In addition, the semiconductor wafer may, however, also be held on the substrate holder, for example, by a reduced pressure between the body and the substrate, by electrostatic attraction force between the body and the substrate, and/or by clamping apparatuses between the body and the substrate. Holders such as these ensure that the semiconductor wafer is held on the body even when the substrate holder is tilted, is accelerated laterally, or if forces are applied to the substrate wafer laterally with respect to the substrate plane.

In this context, the expression a "body" means one or more body elements which are shaped such that they have a first and a second surface area, on both of which the semiconductor wafer can be placed. If the body is a one body element, then this may be integral, which simplifies the production and control of the body. In some embodiments, the body may be a solid body composed of a solid conductive material, for example a metal such as aluminium, copper or brass, or a solid insulating material, for example ceramic, Teflon®, a different plastic, etc.

The expression "semiconductor wafer" may mean a wafer which is composed predominantly of a semiconductor material, that is to say for example of silicon, germanium, or a compound such as SiC, GaAs, SiGe, InP, GaN. Semiconductor wafers are sawed into wafers from a monocrystalline crystal bar (ingot) in the form of a pillar. The diameter of the semiconductor wafers corresponds to the diameter of the crystal bar in the form of a pillar. The industry standard for the diameter of the semiconductor wafers is 1 inch, 2 inches, 3 inches, 4 inches, 5 inches, 6 inches, 8 inches or 12 inches (or 300 mm). The thicknesses of the sawn semiconductor wafers are more typically, depending on the application, between 300 and 800 micrometers.

The present invention relates to an apparatus for holding a substrate, which comprises a body with a surface for a semiconductor wafer to rest on, in which the surface has a first surface area in which a first area of the semiconductor wafer can rest, and a second surface area in which a second area of the semiconductor wafer can rest, and in which the second surface area projects with respect to the first surface area.

The apparatus for processing of a substrate may, for example, be: (a) a separation apparatus for separation of the semiconductor wafer; (b) a marking apparatus for marking of the semiconductor wafer; (c) a contact-making apparatus for making contact with the semiconductor wafer; (d) a vacuum apparatus for pressing the semiconductor wafer onto the body; and/or (e) at least one voltage source for application of a voltage between the body and the semiconductor wafer.

The first surface area of the body, which projects with respect to the second surface area of the body, makes it possible for a semiconductor wafer with a stepped surface profile, for example with a step, to rest on the body. This ensures that semiconductor wafers which have been selectively thinned in one surface area are mechanically supported both in the thin area and in the thick area, so that the thin area does not bend excessively or break.

In the following text, the expression selected thinning of a semiconductor wafer can be understood as meaning removal of semiconductor wafer material on subareas of a main surface of the semiconductor wafer, so that the semiconductor wafer is thicker in one or more first areas than in the one or more second areas in which the surface material has been removed. In this case, the surface material can be removed in subareas by, for example, selective chemical or electrochemical etching, by mechanical plasma or by laser methods.

The selectivity can be made possible, for example, by means of a mask which covers subareas of the semiconductor wafer surface in order that they are not etched, or are etched only slightly, and leaves other areas of the semiconductor wafer open, in order that the etching can take place to a greater extent there. The etching may, for example, be dry etching or wet etching. The selective etching on the main surface of the semiconductor wafer thus results in thick semiconductor wafer areas (first area) and thinned semiconductor wafer areas (second area).

In many cases, semiconductor wafers are structured with a different thickness such that they are thicker in the outer area than in the inner area. The greater thickness in the outer area provides a greater mechanical robustness for the substrate while in the inner area, the thickness is reduced for a desired application. The mechanical robustness is achieved, in particular, when the outer thick area completely surrounds the inner thin area in the semiconductor wafer plane. It is preferable for the first area and the second area of the semiconductor wafer to be concentric with respect to a common axis.

In the field of microelectronics, there is often interest in minimizing the semiconductor chip thickness in order, for example, to minimize the chip package thickness or, for power transistors, the electrical resistance from the chip front face to the rear face. In this case, semiconductor wafers produced in a standard manner are often used for the production of the chips and are subsequently selectively thinned in the inner area from a main surface side, for example by means of masked etching, mechanical grinding, dry or wet-chemical etching, mechanical polishing or laser removal. This results in two areas with two different thicknesses being produced on the semiconductor wafer. If, for example, a concentric outer area of the semiconductor wafer is masked during etching, then a "ring" with a thickness of, for example, 100 to 1000 micrometers is left in the outer area of the semiconductor wafer after the etching process and after removal of the mask, while the thickness of the semiconductor wafer within this ring is reduced, for example, to 30 to 500 micrometers, depending on the thickness of the original material. The method for selective thinning of a semiconductor wafer is known per se, and will not be explained any further here.

It should be noted that there is no need for the thick area of a semiconductor wafer to correspond to an external ring. The thick area may just as well have a quadrilateral shape, may be a ring with one or more interruptions, or may be located in the inner area of the semiconductor wafer. Furthermore, there is no limitation on the size of the semiconductor wafer used. The semiconductor wafer can be either a 1 inch, 4 inch, 6 inch, 8 inch or a 12 inch wafer. The thickness of the semiconductor wafer before thinning may in each case be between 100 and 1000 micrometers or more. The extent of thinning of the semiconductor wafer can be controlled in a simple manner by the duration of material removal. At the moment, the process typically starts with an 8 inch wafer with a thickness of 725 micrometers, with the annular outer area being thinned to 400 micrometers and the inner area of this "ring" being thinned to 150 micrometers. In some embodiments, it can be desirable to reduce the thicknesses in the inner area down to 40 micrometers.

The first surface area of the surface and the second surface area of the surface are preferably arranged in a coplanar form with respect to one another. The rigid arrangement is particularly advantageous when the semiconductor wafers to be processed have the same geometry and in particular the same thickness differences, so that the same substrate holder can be used successively for a large number of semiconductor wafers.

In some embodiments, the first and the second surface area are arranged such that they can move or can be adjusted with respect to one another. In this case, the substrate holder may hold substrate wafers of different geometry in an interlocking manner. For example, a springing in the body can ensure that a force which forces the surface areas apart from one another acts between the first and the second surface area, so that the second surface area is pressed by the spring force against the thinned (second) area of the semiconductor wafer. This also makes it possible to ensure the interlocking nature, even when different semiconductor wafers are thinned to different extents.

In some embodiments, the body has at least one opening in the first and/or second surface area. A connection to a reduced-pressure reservoir or to a vacuum pump can be produced via an opening such as this, by means of which a reduced pressure is produced in the area between the semiconductor wafer and the surface of the substrate holder. A reduced pressure such as this can press the semiconductor wafer onto the body, so that there is good adhesion between the two. This is advantageous when lateral forces press on the semiconductor wafer while contact is being made, during sawing, during marking, and during removal from a film, etc.

In some embodiments, the surface of the body can be connected in an interlocking manner to the first and second area of the semiconductor wafer to be placed on it. This makes it possible to ensure that the semiconductor wafer rests on it over the entire area, thus precluding bending of the semiconductor wafer even if the second area of the semiconductor wafer is very thin. Furthermore, the semiconductor wafer can produce the close contact, which is provided by the interlocking nature, with the body, resulting in a good electrical or thermal contact, when this is desirable.

Interlocking connection includes a connection in which the surface on the thinned side of the semiconductor wafer, preferably over the entire area, rests as closely as possible on the surface of the body of the substrate holder.

In this case, the distance between the surfaces in a direction vertically with respect to the second, projecting surface area should, for example, not be greater than 200 micrometers, and preferably no greater than 100 micrometers, and even more preferably no more than 50 micrometers. In the transitional area, that is to say in the area in which the first surface area merges into the second surface area, the distance between the surfaces of the substrate holder body and the semiconductor wafer should, for example, be no more than 1000 micrometers, and preferably no more than 100 micrometers.

In one embodiment, the first surface area of the surface of the body defines a first plane, and the second surface area of the surface defines a second plane, which are coplanar with respect to one another. This allows the semiconductor wafers which have two different thicknesses to be placed on the body in an interlocking manner. This is the case in particular when the thickness difference between the first area and the second area of the semiconductor wafer corresponds to the distance between the first plane and the second plane. The distance between the first plane and the second plane is preferably less than 1000 micrometers, and is preferably less than 500 micrometers. On the other hand, it is advantageous for the distance between the two planes to be greater than 10 micrometers, or preferably greater than 200 micrometers.

In some embodiments, the first surface area and the second surface area are preferably arranged concentrically with respect to an axis. This allows concentric semiconductor wafers to be placed on the surface of the body in an interlocking manner. Furthermore, it is preferable for the distance between the first surface area and the axis to be greater than 50%, and preferably greater than 95%, of the semiconductor wafer radius. This ensures a sufficiently large thinned semiconductor wafer area.

Alternatively (or additionally), the surface of the bodies of the substrate holder may contain a dielectric layer. An electrical field can be built up across this layer by means of an external voltage between the semiconductor wafer and the body, pressing the semiconductor wafer onto the surface of the body, and holding it in position. The dielectric layer is preferably an oxide, a ceramic or a polymer which has been grown on or applied to the body.

The invention also relates to a method for treatment of a substrate, in which a semiconductor wafer which is thicker in a first surface area than in a second surface area is placed on an apparatus for holding the semiconductor wafer, in which the semiconductor wafer rests on it at least at one point in each case, both in the first surface area and in the second surface area, and in which the semiconductor wafer is processed on the apparatus.

If the processing of the semiconductor wafer involves the semiconductor wafer being pressed onto the body, then this contact pressure can be produced, for example, by production of a reduced pressure between the semiconductor wafer and the body, by production of an electrical voltage between the semiconductor wafer and the body, or by mechanical springing.

If the processing of the semiconductor wafer involves separation of the semiconductor wafer from a mount, then this separation of the semiconductor wafer from the mount can be carried out by means of the substrate holder, which, for example, is pressed by means of a vacuum, electrostatic attraction or mechanically onto the semiconductor wafer. The mount (for example glass, adhesive) can then mechanically be separated from the semiconductor wafer. The mount is, for example, used as a base for the thinning process of the semiconductor wafer, and can be removed again after the thinning process.

If the processing of the semiconductor wafer involves coating or etching of the semiconductor wafer, then this coating process is preferably carried out in a sputtering chamber or a plasma reactor.

If the processing of the semiconductor wafer involves making contact with the semiconductor wafer, then the body is used to support the semiconductor wafer against the pressure of the contact-making elements. The contact-making elements may be individually adjustable contact needles, or else needle cards with a set of preadjusted needles. The contact-making process can be used to test the electrical serviceability of the circuits which have been applied to the semiconductor wafer.

If the processing of the semiconductor wafer involves marking of the semiconductor wafer, then the marking process is preferably carried out using a marking system, a so-called ink machine or an inker. In this method, for example, the circuit units which have been identified as being defective can be marked with a specific ink or by means of a laser, in order to reject them after a separation process.

If the processing of the semiconductor wafer involves separation of the semiconductor wafer, then the separation process can be carried out, for example, by means of a saw or a laser, by means of which the semiconductor wafers are broken up along predetermined paths (scratch frame) to form individual chips. The semiconductor wafer is preferably pressed onto the body during the sawing process by means of a reduced pressure, electrostatic attraction or by means of mechanical attachment to the body, so that the semiconductor wafer is not moved over the body during the sawing process.

If the processing of the semiconductor wafer involves transportation of the semiconductor wafer, then the semiconductor wafer is pressed onto the body during the transportation process, preferably by means of reduced pressure, electrostatic attraction or by means of mechanical attachment to the body, in order that the semiconductor wafer does not become detached from the substrate holder during transportation.

Various embodiments of the invention will now be described with reference to the attached figures.

FIGS. 1a-b show two mutually perpendicular sections through an apparatus for holding a substrate with a first surface area and a second surface area, in which a semiconductor wafer is placed on the apparatus, according some embodiments of the invention. FIGS. 1a and 1b show a substrate holder 1 with a body 2 (substrate holder), on which a semiconductor wafer 7, for example an 8-inch silicon wafer, is placed. The semiconductor wafer 7 is selectively thinned on one main surface 8, so that the semiconductor wafer 7 can be subdivided into a first area 7a, which has not been thinned (a non-thinned area), and into a second area 7b which has been thinned. In this case, the first area 7a is arranged in the edge area of the semiconductor wafer, while the second (thinned) area 7b is arranged in the inner area of the semiconductor wafer.

As shown in FIG. 1b, the first area 7a of the semiconductor wafer surrounds the second area 7b of the semiconductor wafer in an annular shape, so that the first area 7a and the second area 7b are arranged concentrically with respect to the axis 12. The "ring" provides the thinned semiconductor wafer with mechanical robustness for the further processing. The larger the lateral width B of this ring, the greater is the mechanical robustness of the semiconductor wafer 7, but the smaller is the area in which thin chips can be produced. The lateral width of the ring is thus preferably less than 10%, but greater than 1%, of the semiconductor wafer radius R.

Thinning of the semiconductor wafer 7 is normally necessary when, for example, space or circuitry reasons make it necessary to use chip thicknesses which are less than the thicknesses of standard available semiconductor wafers. For example, for vertical power transistors, it is desirable for the chip thickness to be reduced down to 120 micrometers or even down to 40 micrometers, in order to minimize the electrical resistance for the transverse current flow, while in the case of sawing of, for example, 8-inch wafers, thicknesses of about 400 micrometers are required. Thin chip thicknesses are in this case achieved by thinning of the semiconductor wafer from a thickness of about 400 micrometers to about 120 micrometers or even to about 40 micrometers. These figures are only by way of example, and may be widely different, depending on the application. The thicknesses in the first area of the semiconductor wafer are, however, preferably more than 50% thicker than the thicknesses of the semiconductor wafer in the second area.

FIGS. 1a and 1b also show the first surface area 5a and the second surface area 5b of the body 2, in which the second surface area 5b projects with respect to the first surface area 5a by a protrusion V. This protrusion V allows both the first area 7a and the second area 7b of the thinned semiconductor wafer 7 to rest on the surface of the substrate holder 5. This allows the semiconductor wafer 7 to be supported better, in order to prevent excessive bending of the semiconductor wafer.

The protrusion V of the second surface area 5b with respect to the first surface area 5a ideally corresponds to the thinning of the semiconductor wafer 7, that is to say if semiconductor wafers are used which have been thinned from 400 micrometers to 140 micrometers (260 micrometer thinning), then a protrusion V of 260 micrometers would ensure that the first and second areas 7a, 7b of the semiconductor wafers 7 can each rest on the respective first and second surface areas 5a, 5b of the substrate holder, without the thinned second area 7b of the semiconductor wafer bending.

It is also advantageous for the first and the second surface areas 5a, 5b to be coplanar with respect to one another. This allows the coplanar surfaces of the first area 7a and of the second area 7b to rest on the surface 5 of the substrate holder 1 in the entire overlapping area.

In some embodiments, substrate holder 1 is an integrally produced body composed of metal, quartz, ceramic or for example aluminium. If aluminium is used, the substrate holder 2 offers the semiconductor wafer 7 adequate strength in order to support it during processing steps such as electrical testing, sawing or marking. Furthermore, the aluminium-oxide layer which is formed in the atmosphere on the surface 5 of the body 2 offers a good barrier in order to prevent diffusion of the body material into the semiconductor wafer 7, which would contaminate the semiconductor wafer. At the same time, the electrically insulating aluminium-oxide layer can be used to build up an electrical field between the semiconductor wafer 7 and the substrate holder 5, by means of which the semiconductor wafer 7 is pressed against and held on the substrate holder 5. The semiconductor wafer 7 can thus be held in position on the substrate holder 5 even when a lateral force is exerted on the semiconductor wafer 5, or if the substrate holder is tilted or turned over during transportation.

At this point, it should be stated that aluminium is only one of a large number of possible materials for the substrate holder. Depending on the requirements for the treatment of the semiconductor wafer, the materials which are used for the semiconductor wafer may also be other metals, such as copper, gold or alloys (brass) of these metals, for example brass. The materials used may also be insulating materials, such as plastic, Teflon, epoxy or ceramic. A coating of different materials is also feasible. For example, it may be necessary to apply an insulating thin layer to an electrically conductive substrate holder 7 in order to electrically isolate the semiconductor wafer from the substrate holder 5 or, as already mentioned, to apply an electrical field.

It should also be stated that the rotational symmetry of the substrate holder 1 illustrated in FIGS. 1a-1b is often advantageous, but it is not necessary for the apparatus according to the invention. For example, the projecting second surface area may also be quadrilateral or polygonal with any desired number of sides n (n=1, 2, 3, . . . ), or may be any desired rotation body. The second surface area 5b may also be composed of a plurality of surface area elements, which preferably have the same protrusion V with respect to the first surface area 5a. In this case, the substrate holder could have a plurality of projecting elements, whose respective projecting surface elements support the thinned (second) semiconductor wafer area 7b as points, at so many points that the thinned semiconductor wafer area 7b cannot significantly bend.

FIG. 2 shows an apparatus for holding a substrate as in FIG. 1a, in which the second surface area is arranged such that it can move with respect to the first surface area, according to some embodiments of the invention. In some embodiments, FIG. 2 includes an embodiment similar to that shown in FIGS. 1a-b. However, the body 1, in contrast to FIGS. 1a-b, is in the present case composed of two body elements 2a, 2b, with the first body element 2a having the first surface area 5a, and the second body element 2b having the second surface area 5b. The two body elements 2a, 2b are connected to one another such that the second surface area 5b can be shifted in a vertical movement direction M with respect to the first surface area 5a. The vertical movement direction M may, for example, be produced by a sliding guide between the first body element 2a and the second body element 2b. This makes it possible to vary the protrusion V, so that it can be flexibly matched to semiconductor wafers 7 with different degrees of thinning and thicknesses.

Additionally, FIG. 2 shows, schematically, two compressed springs 64, which force the first body element 2a and the second body element 2b apart from one another (and thus the first surface area 5a and the second surface area 5b apart from one another). This allows the second surface area 5b of the substrate holder 1 to be pressed against the second (thinned) area 7b of the semiconductor wafer 7, in order to produce a touching contact. If this pressure is less than the pressure resulting from the intrinsic weight of the thinned area 5*b*, then the springing can be used to reduce the bending of the thinned area 5*b*. In particular, the springing can prevent bending of the thinned semiconductor wafer area when additional forces are exerted on the thinned area, for example when contact needles or probe cards are placed on the thinned area 7*b* in order to test the electrical serviceability of an integrated circuit on the semiconductor wafer.

Figure 3:
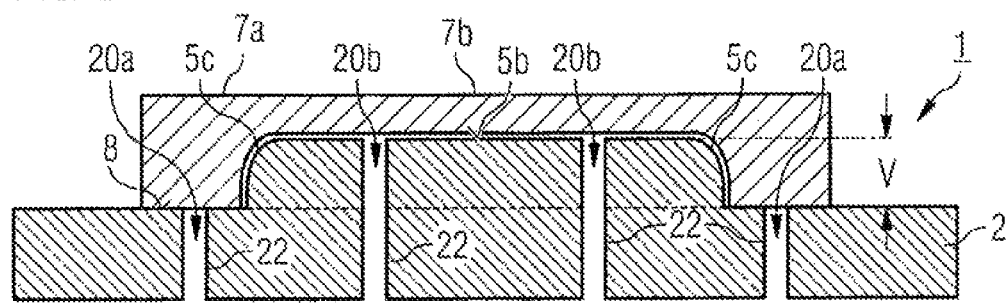
FIG. 3 shows an apparatus for holding a substrate as in FIG. 1a, in which the first and the second surface areas are formed in an interlocking manner with respect to the semiconductor wafer, according to some embodiments of the invention.

FIG. 3 shows an apparatus for holding a substrate as in FIG. 1*a*, in which the first and the second surface areas are formed in an interlocking manner with respect to the semiconductor wafer, according to some embodiments of the invention. FIG. 3 shows a further embodiment, in contrast to FIGS. 1*a-b*, where the first and the second surface areas 5*a*, 5*b* are arranged such that the surface 5 of the substrate holder 1 is connected in an interlocking manner to the semiconductor wafer 7. In particular, the second (thinned) area 7*b* of the semiconductor wafer is essentially precisely of the same size as the second (projecting) surface area 5*b* of the body 2, and the protrusion V is of precisely the same size as the thinning of the semiconductor wafer 7. This allows the entire thinned area 7*b* of the semiconductor wafer 7 to be supported when the semiconductor wafer 7 is placed on the substrate holder 1. This allows the thinned area to be loaded with a probe card everywhere, or to be sawn, without the thinned area 5*b* of the semiconductor wafer being bent or being broken. The gap between the first surface area 5*a* and the first area 7*a* of the semiconductor wafer 7 is preferably less than 100 micrometers, and as far as possible even less than 50 micrometers, over the entire first surface area. In the same way, the gap between the second surface area 5*b* and the second area 7*b* of the semiconductor wafer 7 is as far as possible less than 100 micrometers and as far as possible even less than 10 micrometers over the entire first surface area.

The interlocking nature is as far as possible also provided in the transitional area 5*c*, that is to say the area in which the first surface area 5*b* merges into the second surface area 5*b*. In this area, it is preferably for the gap between the semiconductor wafer 7 and the body 5 to be less than 1000 micrometers, and as far as possible even less than 500 micrometers, over the entire first transitional area 5*c*. The interlocking nature in the transitional area 5*c* ensures that the semiconductor wafer 7 is also fixed at the side, so that the semiconductor wafer 7 remains in position even when lateral forces are exerted on the semiconductor wafer 7.

A further advantage of an interlocking connection between the semiconductor wafer and the substrate holder body 2 is that a force pressing on the substrate holder body 2 can be exerted on the semiconductor wafer 7 without it being possible for the thinned semiconductor wafer area 7*b* to bend. The pressing force allows the semiconductor wafer 7 to be fixed better on the substrate holder body 2.

By way of example, FIG. 3 shows two openings 20*a* in the first surface area 5*a*, and two openings 20*b* in the second surface area 5*b*, which can be connected via corresponding channels 22 to a vacuum pump or to a reduced-pressure reservoir. This makes it possible to produce a reduced pressure between the semiconductor wafer 7 and the substrate holder body 3, which presses the thinned area 7*b* and the thick area 7*a* uniformly onto the surface 5 of the substrate holder body. Thus, in particular, the thinned area 7*b* of the semiconductor wafer 7 rests firmly on the second surface 5*b*.

At this point, it should be stated that FIG. 3 is only provided as a schematic and by way of example. In some embodiments, it may be sufficient for the openings 20*a*, 20*b* to be arranged only in the second surface area 5*b*, since only the thinned area 7*b* need be pressed onto the substrate holder body 5*b*. Similarly, in some embodiments, it is feasible for the openings 20*a*, 20*b* to be arranged only in the first surface area 5*b*, in order to protect the thinned area 7*b* from the pressing pressure.

Furthermore, there are design options as to how many openings 20*a*, 20*b* are provided on the first and/or second surface areas 5*a*, 5*b*, where these are intended to be arranged, and how large they are intended to be. These options depend on how thin and sensitive the thinned area 7*b* of the semiconductor wafer 7 is, how powerful the pump is, etc. that is within the scope of what a person skilled in the art that can be carried out for any given application.

Figure 4:
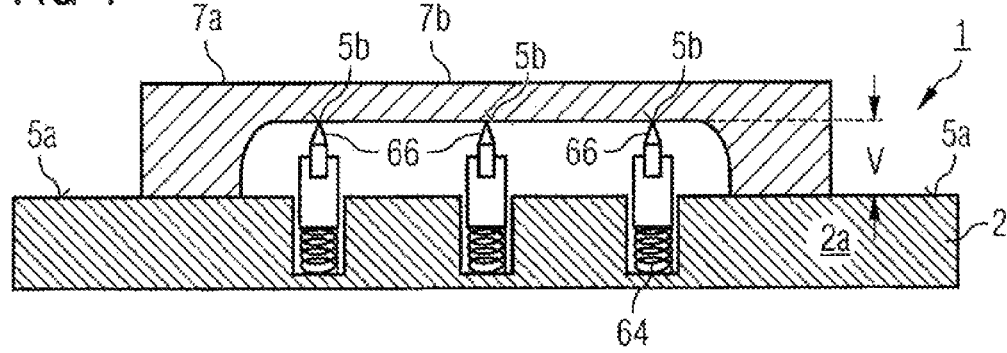
FIG. 4 shows an apparatus for holding a substrate as in FIG. 1a, in which the tips of contact needles form the second surface area, according to some embodiments of the invention.

FIG. 4 shows an apparatus for holding a substrate as in FIG. 1*a*, in which the tips of contact needles form the second surface area, according to some embodiments of the invention. FIG. 4 shows, schematically, a further embodiment which, in some embodiments, is the same as that in FIG. 2. In contrast to FIG. 2, in some embodiments, FIG. 4 has a plurality of projecting contact needles 66, however, which each, at their tip, form second surface areas 5*b* of the size of needle points. As indicated in FIG. 2, the contact needles 66 can each be mounted on a spring 64, which springs 64 press the contact needles along a guide rail (not shown) in a vertical movement direction M in the direction of the thinned area 7*b* of the semiconductor wafer 7. This makes it possible for each contact needle 66 on the one hand to make an additional electrical contact with the semiconductor wafer 7. At the same time, the contact needles can support the thinned semiconductor wafer area 7*b*, in order that this does not droop or break outwards under external pressure.

The embodiment shown in FIG. 4 is a further example, which is representative of a large number of variation options. For example, the number of needles can be adapted and varied as required. Rounded or flattened contact bodies may be used instead of the needles 66. The nature of the sprung suspension of the contact needles 66 in the substrate holder body 2 can also be varied in many ways. For example, instead of the springs, it is possible to use elastic materials, such as an elastic medium composed of a rubber, or a hydraulic drive, or a stepping motor. For high-voltage components, the surface is typically composed of gold. This allows the protrusion V to be matched to different semiconductor wafer types. Furthermore, if the contact needles are able to support the thinned semiconductor wafer area sufficiently, the substrate holder body 2 can be provided with openings 20 in order to allow a vacuum to be applied between the semiconductor wafer 7 and the substrate holder body 2, for better retention.

Figure 5:
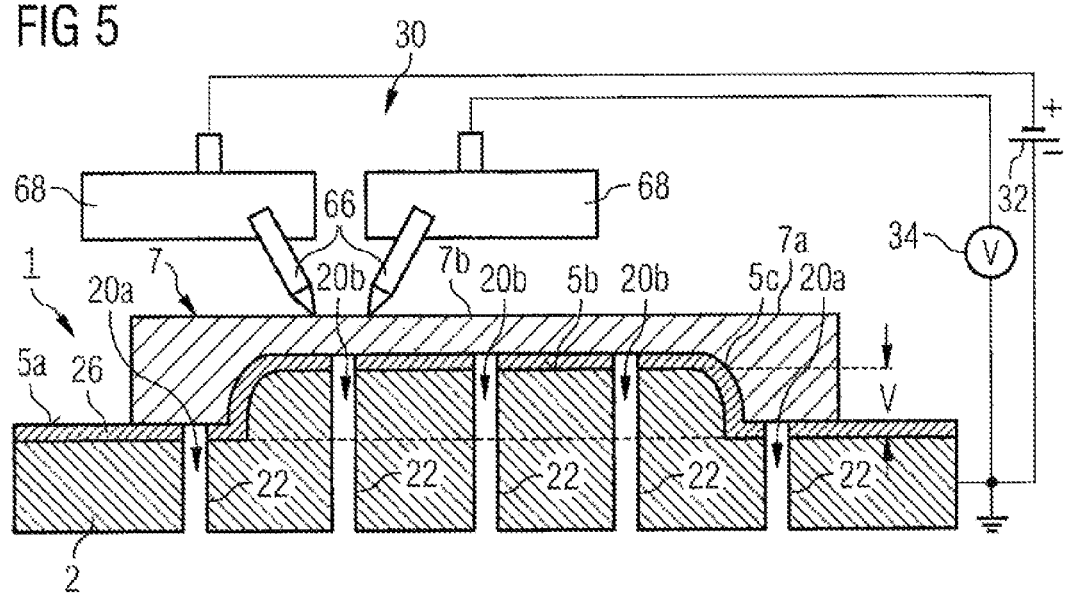
FIG. 5 shows a measurement apparatus for measurement of a semiconductor wafer, according to some embodiments of the invention.

FIG. 5 shows a measurement apparatus 100 for measurement of a semiconductor wafer, according to some embodiments of the invention. Apparatus 100 includes a substrate holder 1, a semiconductor wafer 7 which has been thinned in the central area, a contact-making apparatus 30 for making contact with the semiconductor wafer 7, a voltage source 32, by means of which an electrical voltage can be applied to the semiconductor wafer 7 via the contact-making apparatus 30 and the thinned surface of the semiconductor wafer 7, and a voltage measurement device 34, which measures the voltage tapped off at a desired point in the circuit. The above arrangement allows for testing of an electrical circuit which is integrated on the thinned semiconductor wafer area 7*b*.

In some embodiments, the substrate holder body 2 has a first surface area 5*a* and a second surface area 5*b*. The second surface area 5*b* projects by a distance V with respect to the first surface area 5*a*. The distance V corresponds to the thinning depth with which the semiconductor wafer 7 was thinned in a previous thinning process. The second surface areas 5*a*, 5*b* and the transitional area 5*c*, for example a step, are shaped such that they can be connected in an interlocking manner to the semiconductor wafer 7, which has been thinned selectively in the central area and whose geometry is predetermined. The interlocking connection between the thinned semiconductor wafer side and the surface areas 5a, 5b, 5c of the substrate holder surface 5 is designed such that the gap between the semiconductor wafer 7 and the surface of the substrate holder body 2 is less than 50 micrometers everywhere. This results in the semiconductor wafer 7 being supported well over the entire lower face, in order to allow contact-making elements, for example contact needles 64, to be placed on the upper face of the semiconductor wafer 7, without destroying the thinned areas of the semiconductor wafer 7.

In some embodiments, the substrate holder body 2 in FIG. 5 is an integral body composed of aluminium which is coated on its surface with a thin layer 26 composed of gold or silver and with a thickness, for example, of 50 micrometers. A good electrical contact can be made between the substrate holder body 2 and the thinned side of the semiconductor wafer 7 through the gold (or silver) layer 26. This allows the thinned side of the semiconductor wafer 7 to be earthed or, for example, to be used as a drain contact for a vertical power transistor (not shown).

By way of example, the substrate holder body 2 also has six openings 20a, 20b, which are connected to channels 22, which allow connection to a vacuum pump. This makes it possible to press the semiconductor wafer 7 onto the substrate holder body 2 by means of a reduced pressure between the semiconductor wafer and the surface 5, 5a, 5b, so that a good electrical contact can be made between the gold layer 26 and the thinned surface of the semiconductor wafer 7.

The semiconductor wafer 7 in FIG. 5 is once again one of the wafers which have been thinned in the inner area 7b, as have already been described in the previous embodiments. By way of example, it may be composed of silicon. The semiconductor wafer 7 may already have been processed to such an extent that one or more integrated circuits, for example with one or more power transistors with a gate connection and source connection (not shown in the figure) have been integrated on the semiconductor wafer 7. That surface of the semiconductor wafer 7 which is opposite the integrated circuit may subsequently have been etched selectively with respect to a concentric mask applied in advance in the central area, that is to say in the second semiconductor wafer area 7b, to such an extent that the electrical resistance from the circuit face to the thinned face has fallen below a maximum permissible value. The thickness of the semiconductor wafer 7 in the thinned area may then typically be, for example, 140 micrometers. The semiconductor wafer 7 illustrated in FIG. 5 may, but need not be, a wafer that has been prepared in this manner.

For illustrative reasons, the contact-making shape 30 is shown only schematically. The figure shows two contact needles 66, which are each attached to a manipulator 68 in order to allow the contact needles to be moved vertically, and laterally with respect to this, to a desired position on the semiconductor wafer 7. One of the contact needles 66 is connected via a line to the voltage source 32, that at the other end is connected to earth and to the substrate holder body 2. This allows the contact needle 66 to be set to a desired voltage relative to earth and relative to the substrate holder body 2.

The second illustrated contact needle 66 in FIG. 5 is, in contrast connected to a current measurement device 34. This contact needle can thus measure voltages (which are produced by the currents caused by the voltage source 32 from the front face to the rear face of the semiconductor wafer 7) at different points in the circuit.

The present measurement layout is clearly only one of a large number of options. Probe cards are often used instead of two or more manipulators 68 with needles 66, and have 10, 100 or even more preadjusted needles. The more needles, the greater is the pressure on the semiconductor wafer. The second surface area 5b, which supports the thinned semiconductor wafer area 7b, allows the forces produced by the probe card on the semiconductor wafer 7 to be absorbed.

Figure 6:
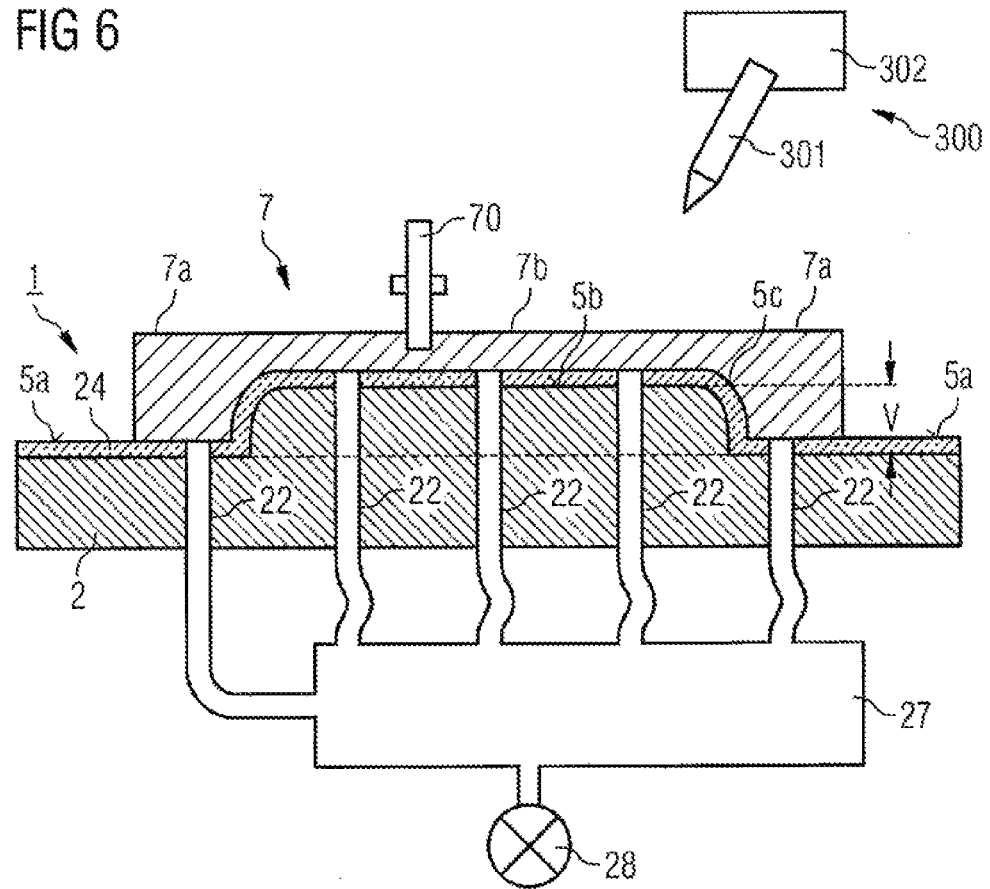
FIG. 6 shows an apparatus for marking and separation of a substrate, according to some embodiments of the invention.

FIG. 6 shows, schematically, one embodiment of an apparatus for separation of a substrate 200. An apparatus such as this may be used, for example, to break up the semiconductor wafer 7 into 10, 100 or even more individual chips.

FIG. 6 once again shows a substrate holder 1, a semiconductor wafer 7 which has been thinned in the central area and has been placed on the substrate holder 1 in an interlocking manner, and, schematically, a saw, which has partially penetrated into the thinned (second) area of the semiconductor wafer 7 in order to separate it.

The present substrate holder body 2 is largely identical to the substrate holder body 2 in FIG. 5. The same reference symbols thus relate to the same elements. In contrast to FIG. 5, the substrate holder body in FIG. 6 does not, however, have any gold or silver layer, but an insulating (dielectric) layer, for example an aluminium-oxide layer 24. There is no need for a gold layer since, during the sawing process, there is no need for an electrical contact between the substrate holder body 2 and the semiconductor wafer 7. The insulating aluminium-oxide layer 24 which is formed on the aluminium also prevents diffusion of aluminium from the substrate holder body 2 into the semiconductor wafer 7.

As in FIG. 5, the substrate holder body 2 in FIG. 6 has a first surface area 5a and a second surface area 5b. The second surface area 5b projects by a distance V with respect to the first surface area 5a. The distance V corresponds to the thinning depth, with which the semiconductor wafer 7 has been thinned in a previous thinning process. The second surface areas 5a, 5b and the transitional area 5c, for example a step, are shaped such that they can be connected in an interlocking manner to the semiconductor wafer 7 which has been thinned selectively in the central area and whose geometry is predetermined. The interlocking connection between the thinned semiconductor wafer side and the surface areas 5a, 5b, 5c of the substrate holder surface 5 is designed such that the gap between the semiconductor wafer 7 and the surface of the substrate holder body 2 is less than 50 micrometers everywhere. The substrate holder body 2 in FIG. 6 is an integral body composed of aluminium, on which a natural insulating aluminium-oxide layer 24 is grown.

Once again, by way of example, the substrate holder body 2 has six openings 20a, 20b, which are connected to channels 22 which allow a connection to a vacuum pump. This makes it possible to press the semiconductor wafer 7 against the substrate holder body 2 by means of a reduced pressure between the semiconductor wafer and the surface 5, 5a, 5b, so that the semiconductor wafer 7 does not slide while being sawn.

The semiconductor wafer 7 in FIG. 6 may be one of the wafers which have been thinned in the inner area 7b, as in FIG. 5. The sawing step is preferably carried out after the production of the integrated circuit and after the electronic circuit test. After being separated, those chips which originate from the thinned (second) semiconductor wafer area 7b are preferably used for further processing.

FIG. 6 shows an apparatus for marking and separation of a substrate, according to some embodiments of the invention. Apparatus shown in FIG. 6 includes a horizontal spindle saw 70, which is used for separation of the semiconductor wafer 7. This has a rapidly rotating diamond saw blade, which is passed in straight lines over the semiconductor wafer. During the process, the saw digs into the semiconductor wafer 7 until the wafer has been cut through. The sawing process along a plurality of parallel lines in mutually perpendicular directions allows the semiconductor wafer 7 to be broken up into numerous rectangular chips. Because of the support by the first and second surface areas 5a and 5b of the substrate holder, the thinned second area 7b of the semiconductor wafer 7 cannot bend and break up in an uncontrolled manner during the sawing process. Because of the interlocking connection between the substrate holder 5 and the semiconductor wafer 7, the semiconductor wafer also cannot be moved in an uncontrolled manner during the sawing process. Even very thin semiconductor wafers can be sawn in a controlled manner in this way. A laser (dry or water guided) can also be used for the separation process.

FIG. 6 also shows, schematically, a marking apparatus 300, which has an ink dispenser 301 and a manipulator 300 which can move the ink dispenser in the vertical and horizontal directions in order to allow it to move the ink dispenser 301 to any desired point on the semiconductor wafer 7, in order to allow the semiconductor wafer 7 to be marked with ink there. The marking may, for example, comprise a dot with which a predetermined semiconductor circuit element is provided in order to indicate that this semiconductor circuit element is defective and, after being separated by the saw 70, is to be thrown away. The marking apparatus 301 can be used at a plurality of points during the processing of the semiconductor wafer 7, for example during or after the test.

By way of example, FIGS. 7a-7c show a method for treatment of a semiconductor wafer 7, according to some embodiments of the invention.

FIG. 7a shows a semiconductor wafer 7 with a homogeneous thickness of, for example, 400 micrometers, after it has been provided on one main surface 8 with a photosensitive varnish layer which has subsequently been structured photolithographically to form a mask 14. In the present case, the mask 14 has been structured such that a "ring" with a lateral ring width B remained only at the outer edge of the semiconductor wafer 7. The lateral ring width is typically chosen such that it still provides sufficient mechanical robustness to the semiconductor wafer 7 after it has been thinned.

FIG. 7a also shows, optionally and schematically, three integrated circuits 18, which are integrated on the unmasked main surface (active main surface) of the semiconductor wafer 7. The integrated circuits 18 have been applied to the semiconductor wafer 7 with the aid of conventional microelectronic production methods. After this, the active side of the semiconductor wafer 7 was then first of all applied to a mount 16, for example a flexible film or a polymer mat (for example epoxy resins). The mount 16 allows the semiconductor wafer 7 to be transported in a protected manner, and protects the integrated circuits 18 during the following etching and processing steps.

FIG. 7a also shows, schematically, the etching step 70 which is carried out after the masking process in order to selectively thin the semiconductor wafer with respect to the mask 14 on the main surface 8. This results in the masked area of the semiconductor wafer remaining in order to form a "thick" first area 7a, while the unmasked area is thinned to a desired extent by the etching process. The thinning process can typically be carried out, for example, from 400 micrometers to 140 micrometers, in which case these values can be varied as desired, depending on the purpose and the original semiconductor wafer material. The etching process can be carried out, for example, wet-chemically or dry-chemically.

In this context, it should be mentioned that the annular structuring of the semiconductor wafer 7 is only one of a large number of options. If, by way of example, the semiconductor wafer is very large, for example 12 inches, and if the thinning of the semiconductor wafer is intended to be very intensive in order to obtain a very thin "fertilized" area 7b for example of less than 50 micrometers, then it is feasible to design the mask such that cruciform mask webs, for example, remain on the semiconductor wafer rather than or in addition to the outer ring, after the thinning process. These "webs" can additionally support the fertilized area (second area) of the semiconductor wafer during the further treatment, and protect it against being broken.

FIG. 7b shows the semiconductor wafer 7 after the selective etching step and after the removal of the mask 14, for example by combustion. This leaves the semiconductor wafer 7 with an annular "thick" area 7a and a thinned area 7b surrounded by the ring. Only the ring remains of the original surface 8. The active main surface is also covered by the mount 16.

FIG. 7c shows a further process step, in which the semiconductor wafer has been flipped and its etched surface has first of all been placed on the substrate holder body 2 (chuck). The chuck has two surface areas, (a) the first surface area 5a and (b) the surface area 5b, which projects by the protrusion V beyond the first surface area. The protrusion V is designed such that it corresponds precisely to the thinning in the previous selective etching step. In consequence, both the thick area 7a and the thinned area 7b of the semiconductor wafer 7 rest on it, so that the thinned area 7b is stabilized on the chuck 2 for further processing.

In addition to the thinned area 7b being supported by the chuck 2, the chuck also has 5 channels 22 via which the chuck 2 is connected to a vacuum reservoir 27 and to a vacuum pump 28. The pump 28 makes it possible to produce a reduced pressure via the channels 22 in the area between the semiconductor wafer and the chuck surface, that is to say between the semiconductor wafer 7 and the first surface area 5a and the second surface area 5b, by means of which the semiconductor wafer 7 is held on the chuck 2, even when the chuck is tilted.

The reduced pressure between the semiconductor wafer 7 and the chuck surface also makes it possible for the mount 16 to be pulled off the sensitive thinned semiconductor wafer area 7b without damaging or breaking the thinned area 7b. This is possible because the reduced pressure presses the thinned semiconductor wafer area 7b onto the planar second surface 5b of the chuck 2, thus preventing the mount from pulling the thinned area 7b upwards when it is pulled off the semiconductor wafer 7.

Furthermore, a method is provided herein for treatment of a substrate, which comprises selective removal of semiconductor wafer material on one main surface (8) of a semiconductor wafer (7), such that the semiconductor wafer is thicker in a first area (7a) of the semiconductor wafer (7) than in a second area (7a) of the semiconductor wafer (7), as well as application of the main surface (8) of the semiconductor wafer (7) to an apparatus for holding the semiconductor wafer (1), with both the first area (7a) and the second area (7b) resting on the apparatus (1) for holding the semiconductor wafer.

Also provided herein is a method for treatment of a substrate comprising selective removal of semiconductor wafer material on a main surface (8) of a semiconductor wafer (7), such that the semiconductor wafer is thicker in a first area (7a) of the semiconductor wafer (7) than in a second area (7a) of the semiconductor wafer (7), and application of the main surface (8) of the semiconductor wafer (7) to an apparatus for holding the semiconductor wafer (1) in which both the first area (7a) and the second area (7b) rest on the apparatus (1) for holding the semiconductor wafer. Additionally, the removal of the semiconductor wafer material is carried out by mechanical grinding, dry or wet-chemical etching, mechanical polishing and/or laser removal.

In some embodiments, the semiconductor wafer (7) is processed by means of at least one of the following steps, namely: pressing of the semiconductor wafer (7) onto the apparatus for holding the substrate described earlier, providing a separation of the semiconductor wafer (7) from a mount (or a chuck), coating of the semiconductor wafer (7), making contact with the semiconductor wafer (7), etching of the semiconductor wafer (7), marking of the semiconductor wafer (7), breaking up the semiconductor wafer (7); and transportation of the semiconductor wafer (7). Additionally, in some embodiments, the second area (7b) of the semiconductor wafer (7) rests on a surface which occupies at least half the area of the semiconductor wafer (7).

Finally, it should once again be stated that the embodiments explained in this description are only examples and do not limit the invention. In particular, it is obvious to a person skilled in the art that the individual features of the embodiments can be combined or developed further depending on the application without this combination departing from the idea of the invention. For example, while the figures show exemplary embodiments in which the semiconductor wafer 7 is pressed onto the surface 5 of the substrate holder body 2 by means of a reduced pressure, each of these examples may, for example, use mechanical brackets rather than a reduced pressure, which brackets press the semiconductor wafer 7 onto the surface 5 of the substrate holder body 2. Alternatively, it is also possible to use an electrical field, which is built up by means of an external voltage between the semiconductor wafer 7 and the substrate holder body 2, and thus presses the semiconductor wafer 7 onto the surface 5 of the substrate holder body 2.

What is claimed is:

1. A method comprising:
    placing a semiconductor wafer in contact with a substrate holder at a first location and a second location of the substrate holder, wherein the second location projects with respect to the first location;
    supporting a thinned portion of the semiconductor wafer using the second location; and
    processing the semiconductor wafer.

2. The method of claim 1, further comprising producing a reduced pressure between the semiconductor wafer and the substrate holder.

3. The method of claim 1, further comprising moving the second location with respect to the first location until the first location is in contact with the semiconductor wafer and the second location is in contact with the semiconductor wafer.

4. The method of claim 1, further comprising forcing the second location away from the first location.

5. The method of claim 4, wherein forcing the second location away from the first location further comprises forcing the second location away from the first location with springs.

6. The method of claim 1, further comprising pressing a contact needle in a direction of the semiconductor wafer.

7. The method of claim 1, further comprising pressing a plurality of contact needles in a direction of the semiconductor wafer.

8. The method of claim 1, wherein placing the semiconductor wafer in contact with the substrate holder further comprises placing the semiconductor wafer in contact with the substrate holder at a first surface area and a second surface area of the substrate holder, wherein the second surface area projects with respect to the first surface area.

9. The method of claim 1, wherein processing the semiconductor wafer further comprises measuring the semiconductor wafer.

10. A method comprising:
    disposing a main surface of a semiconductor wafer on an apparatus for holding the semiconductor wafer including a body with a surface, the surface having a first surface area on which a first area of the semiconductor wafer can rest and a second surface area on which a second area of the semiconductor wafer can rest, wherein the second surface area protrudes with respect to the first surface area and the first area is thicker than the second area; and
    processing the semiconductor wafer.

11. The method of claim 10, further comprising pressing the semiconductor wafer onto the apparatus for holding the semiconductor wafer.

12. The method of claim 10, further comprising providing a separation of the semiconductor wafer from a mount or a chuck.

13. The method of claim 10, further comprising making contact with the semiconductor wafer.

14. The method of claim 10, further comprising marking the semiconductor wafer.

15. The method of claim 10, further comprising breaking up the semiconductor wafer.

16. The method of claim 10, further comprising transporting the semiconductor wafer.

17. A method comprising:
    placing a first portion of a semiconductor wafer on a planar surface of a first body portion of an apparatus for holding the semiconductor wafer;
    placing a second portion of the semiconductor wafer on a planar surface of a second body portion of the apparatus for holding the semiconductor wafer, the planar surface of the second body portion being offset from the planar surface of the first body portion, wherein the second portion of the semiconductor wafer is thinner than the first portion of the semiconductor wafer; and
    processing the semiconductor wafer.

18. The method of claim 17, further comprising forcing the planar surface of the second body portion away from the planar surface of the first body portion.

19. The method of claim 18, wherein forcing the planar surface of the second body portion away from the planar surface of the first body portion further comprises forcing the planar surface of the second body portion away from the planar surface of the first body portion with a spring.

* * * * *